(12) United States Patent
Wang et al.

(10) Patent No.: US 7,105,798 B2
(45) Date of Patent: Sep. 12, 2006

(54) SEMICONDUCTOR LIGHT-RECEIVING DEVICE WITH MULTIPLE POTENTIALS APPLIED TO LAYERS OF MULTIPLE CONDUCTIVITIES

(75) Inventors: Gang Wang, Yamanashi (JP); Yoshihiro Yoneda, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 350 days.

(21) Appl. No.: 10/665,259

(22) Filed: Sep. 22, 2003

(65) Prior Publication Data
US 2004/0056179 A1    Mar. 25, 2004

(30) Foreign Application Priority Data
Sep. 20, 2002    (JP)    ............................. 2002-274304

(51) Int. Cl.
*H01L 31/00*    (2006.01)
(52) U.S. Cl. .................... 250/214.1; 257/290
(58) Field of Classification Search ............ 250/214.1; 257/222, 225, 233, 257, 288, 290, 431
See application file for complete search history.

(56) References Cited

U.S. PATENT DOCUMENTS 6,043,550 A * 3/2000 Kuhara et al. ............... 257/461
6,894,267 B1 * 5/2005 Kakinuma ............... 250/214.1

FOREIGN PATENT DOCUMENTS

JP    2001-127333    5/2001

* cited by examiner

*Primary Examiner*—Stephone B. Allen
*Assistant Examiner*—Patrick J. Lee
(74) *Attorney, Agent, or Firm*—Armstrong, Kratz, Quintos, Hanson & BrooksLLP (57) ABSTRACT

A semiconductor light-receiving device includes: a substrate that has a first surface and a second surface facing each other; a first semiconductor layer that is formed on the first surface of the substrate and includes at least one semiconductor layer of a first conductivity type; a light absorption layer that is formed on the first semiconductor layer and generates carriers in accordance with incident light; a second semiconductor layer that is formed on the light absorption layer and includes at least one semiconductor layer of a second conductivity type; a first electrode part that is electrically connected to the first semiconductor layer and applies a first potential thereto; a second electrode part that is electrically connected to the second semiconductor layer and applies a second potential thereto; and a third semiconductor layer of the second conductivity type that is interposed between the first surface of the substrate and the first semiconductor layer.

42 Claims, 5 Drawing Sheets

SEMICONDUCTOR LIGHT-RECEIVING DEVICE WITH MULTIPLE POTENTIALS APPLIED TO LAYERS OF MULTIPLE CONDUCTIVITIES

BACKGROUND OF THE INVENTION

1. Field of the Invention

The present invention generally relates to a semiconductor light-receiving device, and more particularly, to a PIN photodiode that can perform high-speed operations and can be used in large-capacity optical fiber communication systems.

2. Description of the Related Art

As optical communication systems have been rapidly increasing in capacity, high-speed transmission systems with 40 bps or higher, for example, have been developed in recent years. Semiconductor light-receiving devices to be used in such large-capacity transmission systems need to be capable of operating at high-speed of 40 GHz or higher, and therefore, need to exhibit higher performance and higher reliability than conventional semiconductor light-receiving devices.

Figure 7:
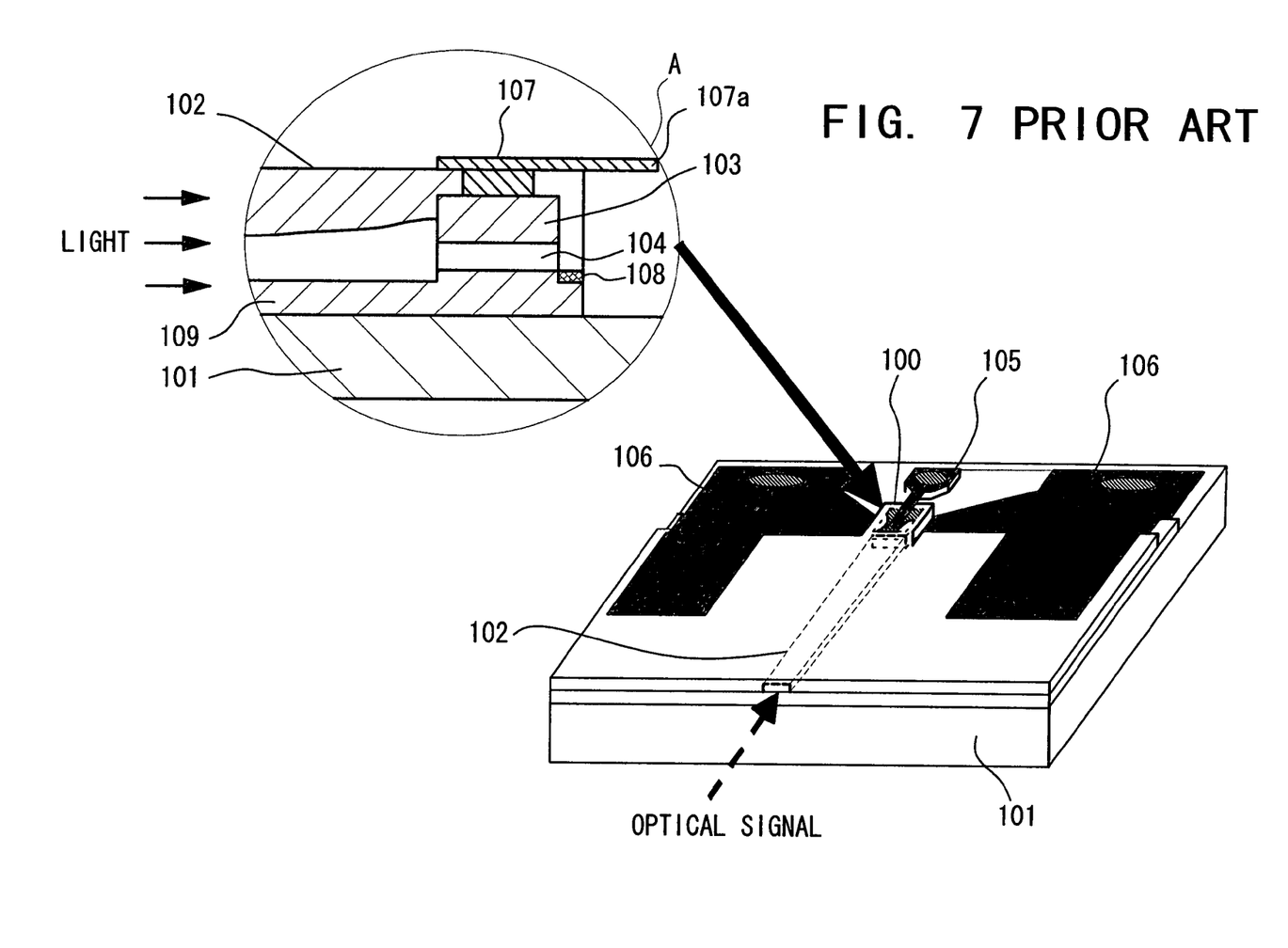
FIG. 7 is a perspective view of a conventional semiconductor light-receiving device.

Japanese Unexamined Patent Publication No. 2001-127333 discloses this type of semiconductor light-receiving device in the form of a PIN photodiode having a tapered optical waveguide structure integrated therein. FIG. 7 is a perspective view of an example structure of the PIN photodiode. In the circle denoted by A in FIG. 7, an enlarged section view of the light receiving unit of the photodiode is shown. As can be seen from FIG. 7, the photodiode 100 has a tapered optical waveguide structure 102 connected to a side surface of a light receiving element 103 over a semi-insulating InP substrate 101. The tapered optical waveguide structure 102 converts the size of light transmitted from optical fibers into a spot size, and then sends the converted light into the light receiving element 103 through a side surface of a light absorption layer 104.

A p-side electrode pad 105 of a predetermined shape is provided on the substrate 101, with an insulating film being interposed in between. Also, n-side electrode pads 106 are provided on the same plane as the p-side electrode pad 105. Accordingly, this photodiode 100 can be connected directly to a substrate of a coplanar strip line substrate. A p-type electrode 107 is formed on top of the light receiving element 103. The p-type electrode 107 is connected to the p-side electrode pad 105 by an air bridge 107a.

An n-type electrode 108 is formed on the surface of an n-type semiconductor layer 109 that is exposed by etching performed on the light receiving element 103 to form a mesa structure. The n-type electrode 108 is connected to the n-side electrode pads 106 extending onto the semiconductor layer 109. The n-side electrode pads 106 occupy large areas to secure a connection region for a bypass capacitor (later described) and to securely provide a ground potential to the n-type electrode 108 in high-frequency operations.

Figure 8:
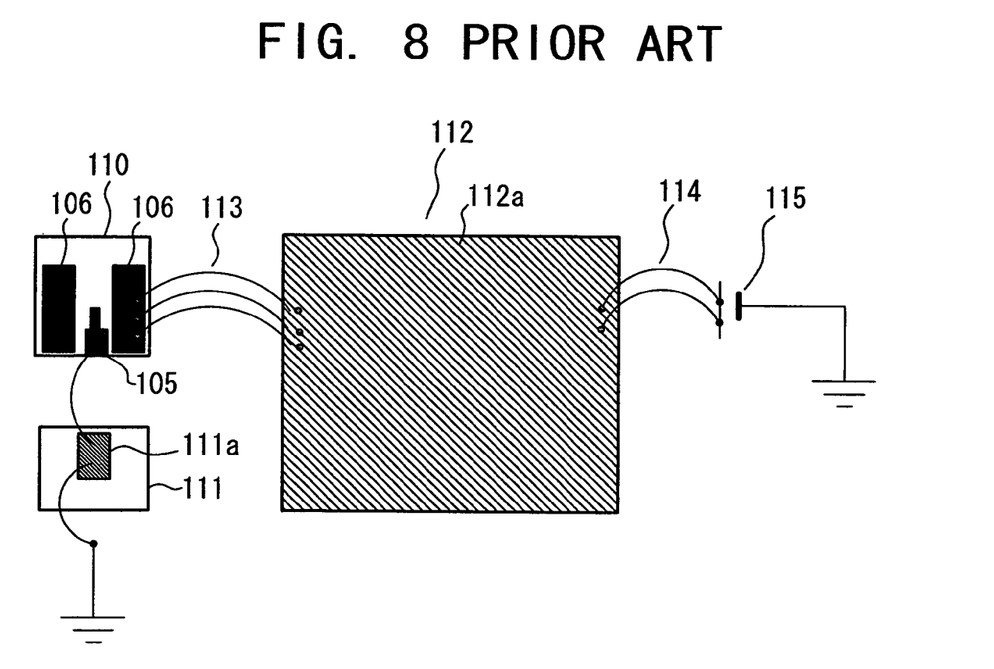
FIG. 8 is a schematic plan view illustrating a conventional light-receiving device mounted in a conventional optical receiver module.

However, in a photodiode having a smaller p-i-n junction area (in the capacity range of 20 fF to 90 fF or lower, for example) than a conventional chip to perform operations at high speeds (about 40 GHz, for example), even a very small noise pulse can cause a high voltage between electrodes, resulting in deterioration of the device. To avoid such a problem, it is necessary for a conventional optical receiver module to employ a large bypass capacitor 112 in the vicinity of the n-side electrode pads 106 of the photodiode 100, when a photodiode chip 110 and an amplifier circuit (preamplifier) 111 for amplifying received signals are mounted on the module, as shown in FIG. 8.

In the optical receiver module, the chip 110 of the photodiode 100 is soldered onto a subcarrier with AuSn (silver paste), so that the metal layer on the bottom surface of the chip 110 is connected to a ground potential. The n-side electrode pads 106 of the photodiode 100 are electrically connected to the upper electrode 112a of the bypass capacitor 112 with wires 113, and the upper electrode 112a is connected to the positive potential side of a dc bias power source 115 with wires 114. The lower electrode of the bypass capacitor 112 is connected to a ground potential. The p-side electrode pad 105 is also connected to a ground potential via an input terminal 111a of the preamplifier 111.

The above semiconductor light-receiving device, however, requires a large area, because the photodiode chip 110 and the bypass capacitor 112 are arranged on the same plane in the light receiver module. Furthermore, the bypass capacitor 112 is at least a few times larger in area than the photodiode chip 110, and sometimes two or more such bypass capacitors are connected. Therefore, it is difficult to reduce the size of each conventional optical receiver module, and it is also difficult to simplify the production process.

Further, it is necessary to employ a large number of wires 113 to connect the upper electrode 112a having a large area to the n-side electrode pads 106 of the photodiode 100. With such a large number of wires 113, the inductance component (L component) becomes so large as to obstruct high-speed operations.

As the p-side electrode pad 105 of the photodiode 100 and the bottom surface (the metal layer) of the chip 110 are both connected to a ground potential, a leak path is formed between the bottom surface (the metal layer) and the n-side electrode pads 106. This causes a problem that the leak current flowing in the module suddenly increases after the mounting of the chip 110, though the chip 110 has only a low leak current.

SUMMARY OF THE INVENTION

It is therefore an object of the present invention to provide a semiconductor light-receiving device in which the above disadvantage is eliminated.

A more specific object of the present invention is to provide a smaller semiconductor light-receiving device that excels in high-speed operations.

Another specific object of the present invention is to provide a semiconductor light-receiving device that can restrain leak current when mounted to a module.

These objects of the present invention are achieved by a semiconductor light-receiving device comprising: a substrate that has a first surface and a second surface facing each other; a first semiconductor layer that is formed on the first surface of the substrate and includes at least one semiconductor layer of a first conductivity type; a light absorption layer that is formed on the first semiconductor layer and generates carriers in accordance with incident light; a second semiconductor layer that is formed on the light absorption layer and includes at least one semiconductor layer of a second conductivity type; a first electrode part that is electrically connected to the first semiconductor layer and applies a first potential thereto; a second electrode part that is electrically connected to the second semiconductor layer and applies a second potential thereto; and a third semiconductor layer of the second conductivity type that is interposed between the first surface of the substrate and the first semiconductor layer.

The above objects of the present invention are also achieved by a semiconductor light-receiving device comprising: a semiconductor substrate that has a first surface and a second surface facing each other; a first semiconductor layer that is formed on the first surface of the semiconductor substrate and includes at least one semiconductor layer of a first conductivity type; a light absorption layer that is formed on the first semiconductor layer and generates carriers in accordance with incident light; a second semiconductor layer that is formed on the light absorption layer and includes at least one semiconductor layer of a second conductivity type; a first electrode part that is electrically connected to the first semiconductor layer and applies a first potential thereto; a second electrode part that is electrically connected to the second semiconductor layer and applies a second potential thereto; and a capacitive element that comprises a dielectric material interposed between the first surface of the semiconductor substrate and the first semiconductor layer.

The above objects of the present invention are also achieved by a semiconductor light-receiving device comprising: a substrate that has a first surface and a second surface facing each other; a first semiconductor layer that is formed on the first surface of the substrate and includes at least one semiconductor layer of a first conductivity type; a light absorption layer that is formed on the first semiconductor layer and generates carriers in accordance with incident light; a second semiconductor layer that is formed on the light absorption layer and includes at least one semiconductor layer of a second conductivity type; a first electrode part that applies a first potential to the first semiconductor layer; a second electrode part that applies a second potential to the second semiconductor layer; a metal layer that is formed on the second surface of the substrate and has a reference potential supplied thereto; and a dielectric layer that is interposed between the metal layer and the second surface of the substrate.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

Figure 1:
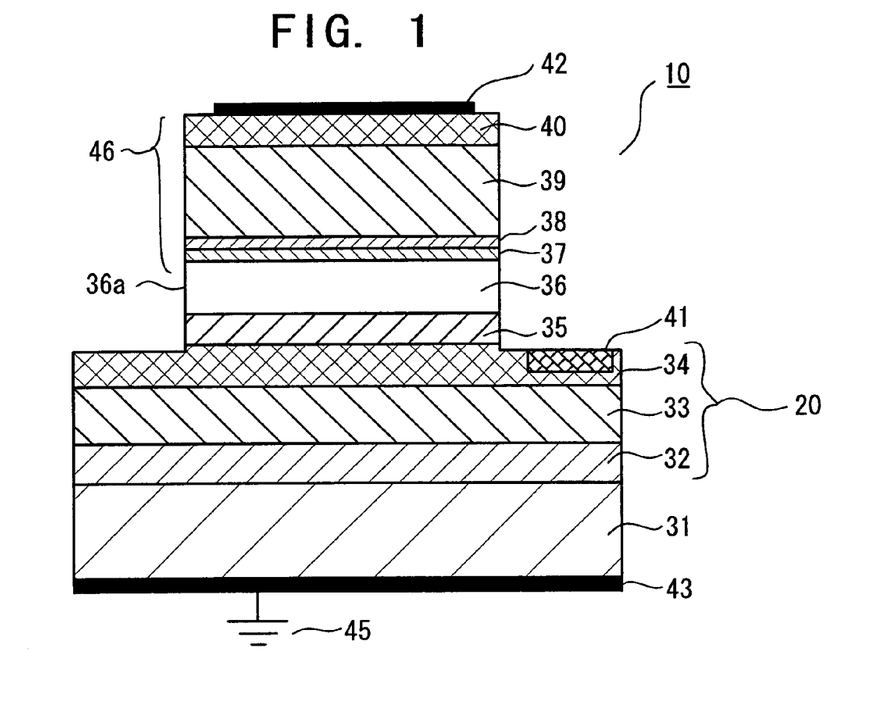
FIG. 1 is a section view of a PIN photodiode in accordance with a first embodiment of the present invention.

FIG. 1 is a section view of a PIN photodiode in accordance with a first embodiment of the present invention. The PIN photodiode 10 of this embodiment has an n-p-n bypass diode 20 integrated on a semiconductor substrate 31. As shown in FIG. 1, an $n^+$-type InP layer 32, a $p^-$-type InP layer 33 (preferably with an impurity concentration of $1\times10^{16}$ $cm^{-3}$ or lower), a contact layer 34 that is an $n^+$-type InP layer, a low-concentration buffer layer 35 that is an $n^-$-type InP layer, an undoped InGaAs light absorption layer 36, graded layers 37 and 38 that are $p^-$-type InGaAsP layers, a $p^+$-type InP layer 39, and a contact layer 40 that is a $P^+$-type InGaAsP layer, are formed on the semiconductor substrate 31 made of InP. The n-p-n bypass diode 20, which is a multilayer buffer structure, is formed from the n-type InP layer 32, the p-type InP layer 33, and the n-type InP contact layer 34.

An n-side electrode 41 made of a double-layered metal of Au and Ge is ohmic-contacted to the contact layer 34, while a p-side electrode 42 made of a double-layered metal of Au and Zn is ohmic-contacted to the contact layer 40. The contact layers have respective impurity concentrations that enable ohmic contacts. Further, a contact metal layer 43 that is a Ti/Pt/Au layer or a TiW/Au layer is formed on the bottom surface of the semiconductor substrate 31.

The n-side electrode 41 has a positive potential, while the p-side electrode 42 has a negative potential. The contact metal layer 43 has a ground potential. With this structure, a reverse bias voltage is applied to the p-side semiconductor layers 37, 38, 39, and 40, and the n-side semiconductor layers 34 and 35, with the light receiving layer 36 as the light receiving element being interposed in between. A reverse bias is also applied to the n-p-n bypass diode 20 to form a depletion layer or a depletion region at the p-n junction between the contact layer 34 and the semiconductor layer 33. This depletion region functions as a capacitor. The capacity of the n-p-n junction is equivalent to the capacity produced by a parallel-plate electrode having an insulator with a depletion layer having a thickness of d at a relative permittivity $\epsilon$. The capacity of the bypass diode 20 is 10 pF, with the thickness of the depleted $p^-$-type InP layer 33 being 0.5 μm, and the chip area being 500×600 μm². A bypass diode with such a capacity can adequately function as a bypass capacitor for a photodiode when integrated. This eliminates the necessity of employing an external bypass capacitor. However, it is still possible to employ both the bypass diode 20 and an external bypass capacitor.

A mesa structure 46 is provided as a light receiving unit on the semiconductor substrate 31. This mesa structure 46 is formed by performing etching on the semiconductor layers from the contact layer 40 to the buffer layer 35. Through the etching process, the surface of the contact layer 34 is partially exposed, and the n-side electrode 41 is formed on the exposed surface of the contact layer 34. The n-p-n bypass diode 20 is not included in the mesa structure 46, but is provided between the mesa structure 46 and the semiconductor substrate 31. With this structure, the area of the p-n junction plane of the bypass diode 20 can be made larger, and the capacitance of the capacitor can be increased accordingly.

Through the formation of the mesa structure 46, a side surface 36a of the light absorption layer 36 is exposed, and an optical waveguide path is provided on that side of the mesa structure 46 over the semiconductor substrate 31, though not shown in FIG. 1. This optical waveguide path leads to the side surface 36a of the light absorption layer 36.

Light is guided through the optical wavelength path, and then enters the light absorption layer 36 through the side surface 36a.

Figure 6:
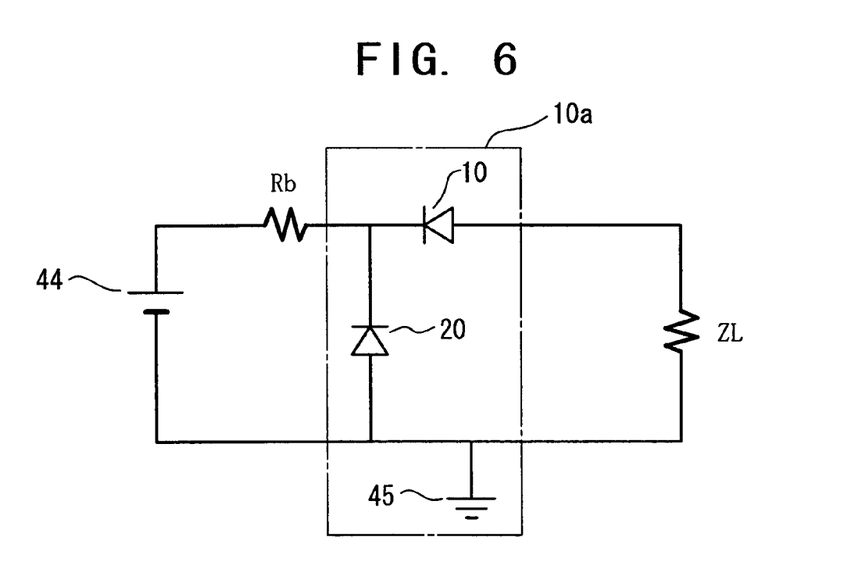
FIG. 6 is an equivalent circuit in a module that includes the PIN photodiode shown in FIG. 1.

FIG. 6 illustrates an equivalent circuit in a module that includes the PIN photodiode shown in FIG. 1. As described above, the PIN photodiode 10 has the bypass diode 20 integrated on the semiconductor substrate 31 to form a chip or a device 10a. The anodes of the photodiode 10 and the n-p-n bypass diode 20 are connected to a ground potential 45 via a load ZL. More preferably, the module or a casing into which the chip 10a is mounted should be grounded, and the anodes should be connected to the module or the casing. The cathodes of the photodiode 10 and the bypass diode 20 are connected to the positive potential of a dc power source 44 via a load Rb. Here, the bypass diode 20 and the photodiode 10 are connected in parallel.

The operation of the PIN photodiode 10 will now be described. In operation, a reverse bias is applied between the n-side electrode 41 and the p-side electrode 42 of the photodiode 10. When light enters the light absorption layer 36 through the side surface 36a after passing through the optical waveguide path, electrons and holes are generated in the light absorption layer 36, and these carriers move in the thickness direction of the light absorption layer 36. The electrons reach the n-side electrode 41 via the buffer layer 35 and the contact layer 34, while the holes reach the p-side electrode 42 via the p-side semiconductor layers 37, 38, 39, and 40. After that, the current generated in accordance with the incident light is detected from both the n-side electrode 41 and the p-side electrode 42.

Here, a depletion region that is to function as a capacitor is formed at the junction between the contact layer 34 and the p-type InP layer 33 in the n-p-n bypass diode 20, with a reverse bias having been applied. As the n-p-n bypass diode 20 and the photodiode 10 are connected in parallel, this capacitor functions as a bypass capacitor. Also, as a reverse-biased p-n junction exists between the n-side electrode 41 and the contact metal layer 43, a leak path between the n-side electrode 41 and the contact metal layer 43 is blocked, and thereby, "dark current", the current which is generated from the light absorption layer 36 and flows to the contact metal layer 43 via the semiconductor substrate 31, can be restrained effectively. Thus, current that depends on the amount of light received can be extracted via the electrodes 41 and 42 accurately.

With the bypass diode 20 being stacked on a monolithic substrate, the size of the bypass capacitor or the number of bypass capacitors to be externally attached to the PIN photodiode 10 can be reduced. Accordingly, the module or the casing onto which the photodiode 10 is mounted can be made smaller. It is of course possible to replace an external bypass capacitor with the bypass diode 20 that assumes all the functions of the external bypass capacitor. Also, with the size of the external bypass capacitor or the number of external bypass capacitors being reduced, a smaller number of wires are required for connecting the external bypass capacitor(s), and the inductance component accompanying the wires can be reduced accordingly. Thus, the frequency response characteristics can be improved. More preferably, high-speed operations should be performed at 35 GHz to 40 GHz or higher.

According to the first embodiment mentioned above, the semiconductor light-receiving device includes a substrate (31) that has a first surface and a second surface facing each other; a first semiconductor layer that is formed on the first surface of the substrate and includes at least one semiconductor layer (34, 35) of a first conductivity type (n type); a light absorption layer (36) that is formed on the first semiconductor layer and generates carriers in accordance with incident light; a second semiconductor layer (46) that is formed on the light absorption layer and includes at least one semiconductor layer such as layer (39) of a second conductivity type (p type); a first electrode part (41) that is electrically connected to the first semiconductor layer and applies a first potential thereto; a second electrode part (42) that is electrically connected to the second semiconductor layer and applies a second potential thereto; and a third semiconductor layer (33) of the second conductivity type (p type) that is interposed between the first surface of the substrate (31) and the first semiconductor layer.

Second Embodiment

Figure 2:
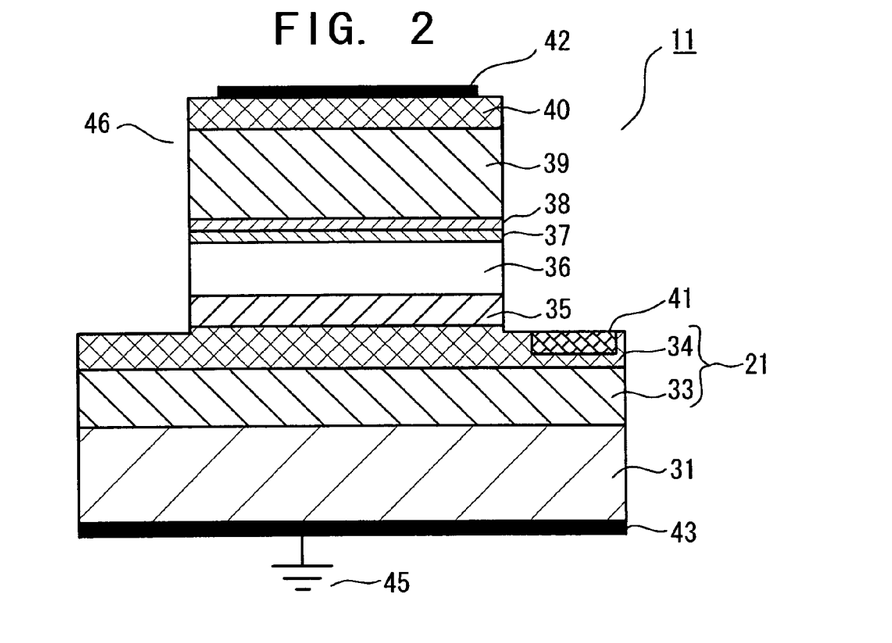
FIG. 2 is a section view of a PIN photodiode in accordance with a second embodiment of the present invention.

Referring now to FIG. 2, a second embodiment of the present invention will be described. FIG. 2 is a section view of a PIN photodiode 11 in accordance with the second embodiment. This photodiode 11 is substantially the same as the photodiode 10 of the first embodiment, except that the n-type InP layer 32 is removed, with the p-type InP layer 33 being formed directly on the semiconductor substrate 31.

The p-type InP layer 33 and the n-type contact layer 34 are formed on the semiconductor substrate 31. A positive potential is supplied to the n-side electrode 41, and the contact metal layer 43 has a ground potential. Accordingly, a reverse bias voltage is applied to the p-n junction between the InP layer 33 and the contact layer 34, thereby forming a depletion region at the p-n junction that is to serve as a capacitor 21. The capacitor 21 operates basically in the same manner as the bypass diode 20 of the first embodiment.

Third Embodiment

Figure 3:
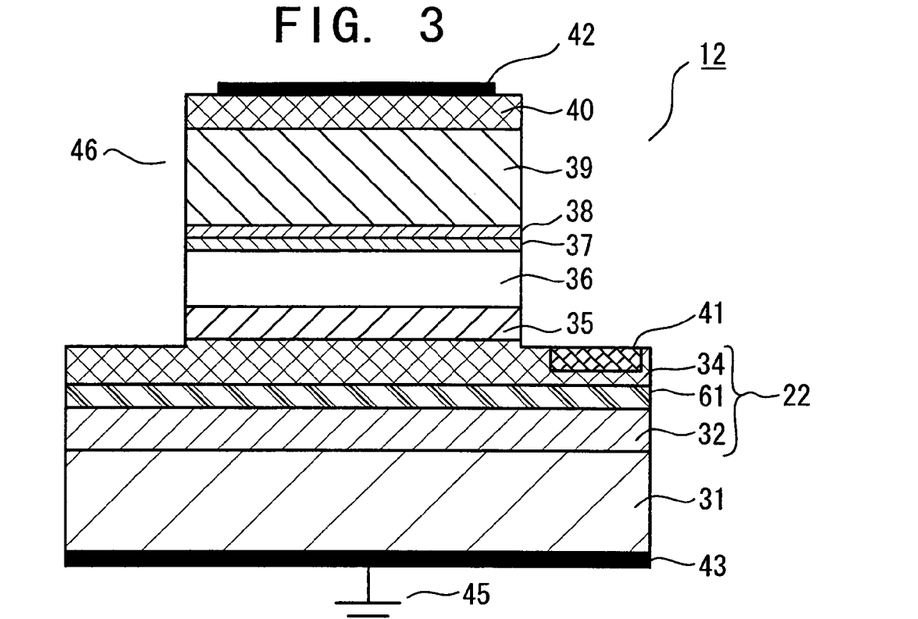
FIG. 3 is a section view of a PIN photodiode in accordance with a third embodiment of the present invention.

FIG. 3 is a section view of a PIN photodiode 12 in accordance with a third embodiment of the present invention. In this embodiment, the capacitor 21 utilizing the p-n junction is not integrated, but a capacitive element 22 having a dielectric material interposed between a pair of conductive layers is provided. More specifically, the n-type InP layer 32 is formed on the semiconductor substrate 31. A dielectric layer 61 that is a semiconductor insulating film or a high-resistance semiconductor layer is then formed on the n-type InP layer 32. The n-type contact layer 34 is then stacked on the dielectric layer 61, thereby forming the capacitive element 22. This capacitive element 22 functions as a bypass capacitor for the photodiode 12, and restrains dark current from flowing toward the semiconductor substrate 31 when light is received.

Fourth Embodiment

Figure 4:
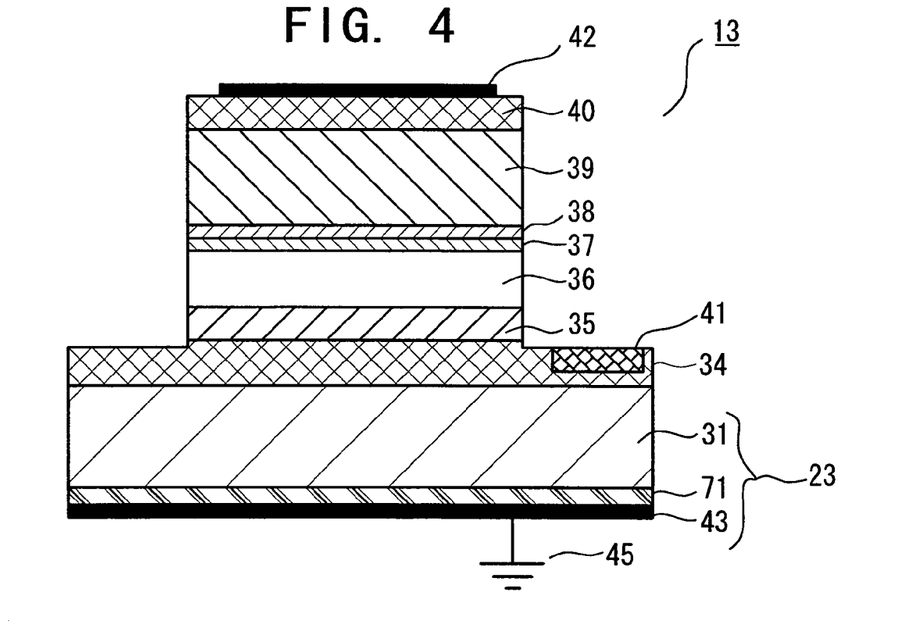
FIG. 4 is a section view of a PIN photodiode in accordance with a fourth embodiment of the present invention.

FIG. 4 is a section view of a PIN photodiode 13 in accordance with a fourth embodiment of the present invention. In this embodiment, a capacitor is not formed on the semiconductor substrate 31, but is formed under the semiconductor substrate 31. More specifically, a dielectric material 71 is provided under the lower surface of the semiconductor substrate 31, and the contact metal layer 43 is provided under the lower surface of the dielectric material 71, thereby forming a capacitor 23. The dielectric material 71 provided under the lower surface of the semiconductor substrate 31 is not necessarily a semiconductor layer or a high-resistance semiconductor layer, but may be an insulating thin film made of $SiO_2$, SiNx, ceramics, or the like.

Figure 5:
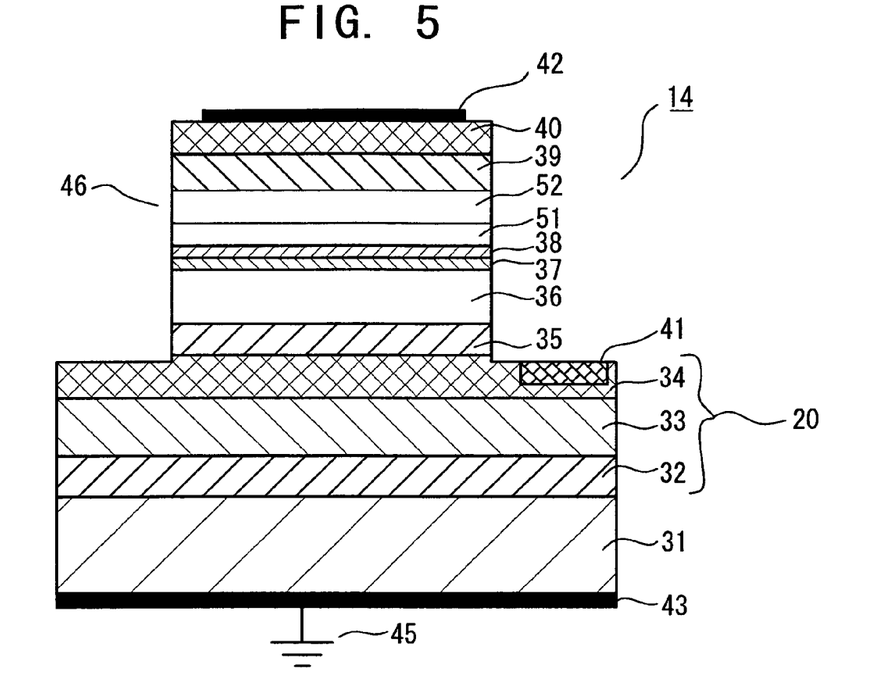
FIG. 5 is a section view of an avalanche photodiode in accordance with a fifth embodiment of the present invention.

Referring now to FIG. 5, a fifth embodiment of the present invention will be described. FIG. 5 is a section view of an avalanche photodiode in accordance with the fifth embodiment. In this avalanche photodiode, the number of carriers in the form of electrons and holes generated by incident light is multiplied by avalanche multiplication, so that a high-speed response to the incident light can be achieved. As shown in FIG. 5, an n$^+$-type InP layer 51 for the avalanche multiplication and an i- or n-type InP multiplication layer 52 are formed on the graded layer 38. The n-p-n bypass diode 20 is the same as that of the first embodiment. It is of course possible to replace the bypass diode 20 with any of the capacitive element and the capacitors of the second through fourth embodiments.

Although the light absorption layer 36 in each of the foregoing embodiments is an undoped InGaAs layer, a p- or n-type InGaAs layer may be used for the light absorption layer 36. III–IV compound semiconductors other than the above may be used. In the semiconductor light-receiving devices of the foregoing embodiments, light enters through a side surface or an end surface of the mesa structure. However, it is also possible to apply the present invention to a light receiving device in which light enters through the top of the mesa structure or the bottom surface of the substrate. Further, the number and compositions of the p- and n-type semiconductor layers stacked on and under the light absorption layer 36 are not limited to those of the above embodiments, but may be changed if necessary. The semiconductor light-receiving device of the invention may include an avalanche photodiode or phototransistor.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor light-receiving device comprising:
    a substrate that has a first surface and a second surface opposite to each other;
    a first semiconductor layer that is formed above the first surface of the substrate and includes at least one semiconductor layer portion of a first conductivity type;
    a light absorption layer that is formed above the first semiconductor layer and generates carriers in accordance with incident light;
    a second semiconductor layer that is formed above the light absorption layer and includes at least one semiconductor layer portion of a second conductivity type;
    a first electrode part that is electrically connected to the first semiconductor layer and applies a first potential thereto;
    a second electrode part that is electrically connected to the second semiconductor layer and applies a second potential thereto;
    a third semiconductor layer of the second conductivity type provided so that the substrate, the third semiconductor layer and the first semiconductor layer are arranged in this order; and
    a third electrode part that is electrically connected to the substrate and applies a third potential thereto,
    the first potential being higher than the third potential.

2. The semiconductor light-receiving device as claimed in claim 1, further comprising a capacitor that includes a p-n junction between the first semiconductor layer and the third semiconductor layer.

3. The semiconductor light-receiving device as claimed in claim 2, wherein the capacitor has a depletion-layer region that is formed at the p-n junction between the first semiconductor layer and the third semiconductor layer.

4. The semiconductor light-receiving device as claimed in claim 1, further comprising
    a fourth semiconductor layer of the first conductivity type, wherein the third semiconductor layer is interposed between the first semiconductor layer and the fourth semiconductor layer.

5. The semiconductor light-receiving device as claimed in claim 2, wherein the capacitor functions as a bypass capacitor that bypasses current flowing between the first semiconductor layer and the second semiconductor layer when carriers are generated in the light absorption layer.

6. The semiconductor light-receiving device as claimed in claim 1, wherein the first semiconductor layer includes a contact layer that is connected to the first electrode part and has a relatively high impurity concentration.

7. The semiconductor light-receiving device as claimed in claim 1, wherein the second semiconductor layer includes a contact layer that is connected to the second electrode part and has a relatively high impurity concentration.

8. The semiconductor light-receiving device as claimed in claim 1, wherein the first semiconductor layer includes a buffer layer having a relatively low impurity concentration.

9. The semiconductor light-receiving device as claimed in claim 1, wherein the second semiconductor layer includes a graded layer in which a plurality of semiconductor layers are stacked so that forbidden bandwidths vary smoothly.

10. The semiconductor light-receiving device as claimed in claim 1, wherein:
    at least the light absorption layer and the second semiconductor layer form a mesa structure; and
    light enters through a side surface of the light absorption layer that is exposed in the mesa structure.

11. The semiconductor light-receiving device as claimed in claim 10, further comprising an optical waveguide path that is provided on a side of the mesa structure and guides light into the light absorption layer.

12. The semiconductor light-receiving device as claimed in claim 10, wherein:
    the first semiconductor layer has a surface exposed at the bottom of the mesa structure; the first electrode part is formed on the exposed surface; and
    the second electrode part is formed on the second semiconductor layer of the mesa structure.

13. The semiconductor light-receiving device as claimed in claim 1, comprising an avalanche diode.

14. The semiconductor light-receiving device as claimed in claim 1, wherein:
    the first semiconductor layer includes an n-type InP layer; and
    the second semiconductor layer includes a p-type InP layer.

15. The semiconductor light-receiving device as claimed in claim 1, wherein the light absorption layer is an InGaAs layer.

16. The semiconductor light-receiving device as claimed in claim 1, wherein the third semiconductor layer is a p-type InP layer and has an impurity concentration of $1 \times 10^{16}$ cm$^{-3}$ or lower.

17. A semiconductor light-receiving device comprising:
    a semiconductor substrate that has a first surface and a second surface opposite to each other;

a first semiconductor layer that is formed above the first surface of the semiconductor substrate and includes at least one semiconductor layer portion of a first conductivity type;

a light absorption layer that is formed above the first semiconductor layer and generates carriers in accordance with incident light;

a second semiconductor layer that is formed above the light absorption layer and includes at least one semiconductor layer portion of a second conductivity type;

a first electrode part that is electrically connected to the first semiconductor layer and applies a first potential thereto;

a second electrode part that is electrically connected to the second semiconductor layer and applies a second potential thereto; and a capacitive element that comprises a dielectric material provided so that the first surface of the semiconductor substrate, the dielectric material and the first semiconductor layer are arranged in this order.

18. The semiconductor light-receiving device as claimed in claim 17, wherein the capacitive element includes a high-resistance semiconductor layer that is interposed between a pair of semiconductor layers of the first conductivity type.

19. The semiconductor light-receiving device as claimed in claim 17, wherein a third potential equal to the second potential is supplied to the second surface of the substrate.

20. The semiconductor light-receiving device as claimed in claim 17, wherein the first semiconductor layer includes a contact layer that is connected to the first electrode part and has a relatively high impurity concentration.

21. The semiconductor light-receiving device as claimed in claim 17, wherein the second semiconductor layer includes a contact layer that is connected to the second electrode part and has a relatively high impurity concentration.

22. The semiconductor light-receiving device as claimed in claim 17, wherein the first semiconductor layer includes a buffer layer having a relatively low impurity concentration.

23. The semiconductor light-receiving device as claimed in claim 17, wherein the second semiconductor layer includes a graded layer in which a plurality of semiconductor layers are stacked so that forbidden bandwidths vary smoothly.

24. The semiconductor light-receiving device as claimed in claim 17, wherein:
at least the light absorption layer and the second semiconductor layer form a mesa structure; and
light enters through a side surface of the light absorption layer that is exposed in the mesa structure.

25. The semiconductor light-receiving device as claimed in claim 24, further comprising an optical waveguide path that is provided on a side of the mesa structure and guides light into the light absorption layer.

26. The semiconductor light-receiving device as claimed in claim 24, wherein:
the first semiconductor layer has a surface exposed at the bottom of the mesa structure;
the first electrode part is formed on the exposed surface; and
the second electrode part is formed on the second semiconductor layer of the mesa structure.

27. The semiconductor light-receiving device as claimed in claim 17, comprising an avalanche diode.

28. The semiconductor light-receiving device as claimed in claim 17, wherein:

the first semiconductor layer includes an n-type InP layer; and
the second semiconductor layer includes a p-type InP layer.

29. The semiconductor light-receiving device as claimed in claim 17, wherein the light absorption layer is an InGaAs layer.

30. The semiconductor light-receiving device as claimed in claim 17, wherein the capacitive element functions as a bypass capacitor that bypasses current flowing between the first semiconductor layer and the second semiconductor layer when carriers are generated in the light absorption layer.

31. A semiconductor light-receiving device comprising:
a substrate that has a first surface and a second surface opposite to each other;
a first semiconductor layer that is formed above the surface of the substrate and includes at least one semiconductor layer portion of a first conductivity type;
a light absorption layer that is formed above the first semiconductor layer and generates carriers in accordance with incident light;
a semiconductor layer that is formed above the light absorption layer and includes at least one semiconductor layer portion of a second conductivity type;
a first electrode part that applies a first potential to first semiconductor layer;
a second electrode part that applies a second potential to the second semiconductor layer;
a metal layer that is formed on the second surface of the substrate and has a reference potential supplied thereto, wherein the first potential is higher than the reference potential; and
a dielectric layer provided so that the metal layer, the dielectric later and the second surface of the substrate are arranged in this order,
a capacitor including dielectric layer being formed in the semiconductor light-receiving device.

32. The semiconductor light-receiving device as claimed in claim 31, comprising a module onto which the substrate is mounted, wherein the metal layer is electrically connected to the module and is supplied with the reference potential.

33. The semiconductor light-receiving device as claimed in claim 31, wherein the first semiconductor layer includes a contact layer that is connected to the first electrode part and has a relatively high impurity concentration.

34. The semiconductor light-receiving device as claimed in claim 31, wherein the second semiconductor layer includes a contact layer that is connected to the second electrode part and has a relatively high impurity concentration.

35. The semiconductor light-receiving device as claimed in claim 31, wherein the first semiconductor layer includes a buffer layer having a relatively low impurity concentration.

36. The semiconductor light-receiving device as claimed in claim 31, wherein the second semiconductor layer includes a graded layer in which a plurality of semiconductor layers are stacked so that forbidden bandwidths vary smoothly.

37. The semiconductor light-receiving device as claimed in claim 31, wherein:
at least the light absorption layer and the second semiconductor layer form a mesa structure; and
light enters through a side surface of the light absorption layer that is exposed in the mesa structure.

38. The semiconductor light-receiving device as claimed in claim 37, further comprising an optical waveguide path that is provided on a side of the mesa structure and guides light into the light absorption layer.

39. The semiconductor light-receiving device as claimed in claim 37, wherein:
the first semiconductor layer has a surface exposed at the bottom of the mesa structure;
the first electrode part is formed on the exposed surface; and
the second electrode part is formed on the second semiconductor layer of the mesa structure.

40. The semiconductor light-receiving device as claimed in claim 31, comprising an avalanche diode.

41. The semiconductor light-receiving device as claimed in claim 31, wherein:
the first semiconductor layer includes an n-type InP layer; and
the second semiconductor layer includes a p-type InP layer.

42. The semiconductor light-receiving device as claimed in claim 31, wherein the light absorption layer is an InGaAs layer.

* * * * *